United States Patent
Uchino et al.

(10) Patent No.: US 12,061,241 B2
(45) Date of Patent: Aug. 13, 2024

(54) RECHARGEABLE BATTERY SHORT CIRCUIT EARLY DETECTION DEVICE AND RECHARGEABLE BATTERY SHORT CIRCUIT EARLY DETECTION METHOD

(71) Applicants: FURUKAWA ELECTRIC CO., LTD., Tokyo (JP); FURUKAWA AUTOMOTIVE SYSTEMS INC., Shiga (JP)

(72) Inventors: Naotaka Uchino, Tokyo (JP); Etsuzo Sato, Tokyo (JP)

(73) Assignees: FURUKAWA ELECTRIC CO., LTD., Tokyo (JP); FURUKAWA AUTOMOTIVE SYSTEMS INC., Shiga (JP)

(*) Notice: Subject to any disclaimer, the term of this patent is extended or adjusted under 35 U.S.C. 154(b) by 0 days.

(21) Appl. No.: 18/104,430

(22) Filed: Feb. 1, 2023

(65) Prior Publication Data
US 2023/0168316 A1     Jun. 1, 2023

Related U.S. Application Data

(60) Division of application No. 16/810,506, filed on Mar. 5, 2020, now Pat. No. 11,624,787, which is a (Continued)

(30) Foreign Application Priority Data

Sep. 21, 2017 (JP) ................................. 2017-181846

(51) Int. Cl.
*H02J 7/00* (2006.01)
*G01R 31/36* (2020.01)
(Continued)

(52) U.S. Cl.
CPC ......... *G01R 31/52* (2020.01); *G01R 31/3646* (2019.01); *G01R 31/382* (2019.01);
(Continued)

(58) Field of Classification Search
CPC .. H02J 50/12; H02J 50/80; H02J 50/70; H02J 50/90; H02J 50/60; H02J 50/50;
(Continued)

(56) References Cited

U.S. PATENT DOCUMENTS 6,268,710 B1   7/2001 Koga
6,563,318 B2   5/2003 Kawakami et al.
(Continued)

FOREIGN PATENT DOCUMENTS

CN   1391305 A    1/2003
CN   101765941 A  6/2010
(Continued)

OTHER PUBLICATIONS

European Office Action dated Jun. 2, 2023, in a counterpart European patent application No. 18857775.3.
(Continued)

*Primary Examiner* — Binh C Tat
(74) *Attorney, Agent, or Firm* — CHEN YOSHIMURA LLP

(57) ABSTRACT

A rechargeable battery short-circuit early detection device that detects a short-circuit in a rechargeable battery includes one or more processors connected to a current sensor that detects a charging current of the rechargeable battery, wherein the one or more processors are programmed to: if a detected temporal slope of the charging current exceeds a first threshold, determine that there is a possibility that a short circuit has occurred in at least one of the cells; detect anew a temporal slope of the charging current after a prescribed period of time has elapsed since the determina-
(Continued)

tion of said possibility; and thereafter, if the anew detected temporal slope of the charging current exceeds a second threshold that is greater than the first threshold, determine that there is a possibility that the short-circuit is progressing, and output a signal indicating said possibility.

5 Claims, 9 Drawing Sheets

Related U.S. Application Data continuation of application No. PCT/JP2018/013637, filed on Mar. 30, 2018.

(51) Int. Cl.
  *G01R 31/382* (2019.01)
  *G01R 31/392* (2019.01)
  *G01R 31/396* (2019.01)
  *G01R 31/52* (2020.01)
  *H01M 10/48* (2006.01)

(52) U.S. Cl.
  CPC ......... *G01R 31/392* (2019.01); *G01R 31/396* (2019.01); *H01M 10/48* (2013.01); *H02J 7/0029* (2013.01); *H02J 7/0047* (2013.01)

(58) Field of Classification Search
  CPC ........ H02J 7/00; H02J 7/0047; H02J 7/00304; H02J 7/00034; H02J 7/00036; H02J 7/00047; H02J 9/061; H02J 7/0042; H02J 2310/40; H02J 50/005; H02J 50/502; H02J 7/35; H02J 2310/48; H02J 7/0029; H02J 7/00309; H02J 50/05; H02J 50/40; H02J 7/0013; H02J 7/00308; H02J 50/402; H02J 7/00302; H02J 7/1423; H02J 2207/40; H02J 3/381; H02J 2207/20; H02J 2300/24; H02J 2310/44; H02J 7/00041; H02J 7/00045; H02J 7/0045; H02J 7/0049; H02J 7/0068; H02J 7/0071; H02J 7/007192; H02J 2310/46; H02J 3/322; H02J 50/10; H02J 2300/26; H02J 2310/14; H02J 2310/23; H02J 3/14; H02J 3/46; H02J 50/20; H02J 7/0016; H02J 7/0019; H02J 7/00714; H02J 7/007182; H02J 7/007194; H02J 7/0048; H02J 7/007; B60L 53/65; B60L 53/126; B60L 53/122; B60L 53/39; B60L 58/22; H04L 67/12; H04L 63/1416; H04L 67/10; H01Q 1/22; H01L 27/14645; H01L 27/14649; H01L 27/14665; H01L 21/3065; H01M 10/425; H01M 10/4285; H01M 10/44; H01M 10/48; H01M 10/482; H01M 10/486; H01M 2010/4271; H01M 2010/4278; H01B 17/40
  USPC .................................................. 320/137–148
  See application file for complete search history.

(56) References Cited

U.S. PATENT DOCUMENTS

| | | |
|---|---|---|
| 9,059,602 B2 | 6/2015 | Tsuchiya et al. |
| 2003/0006735 A1 | 1/2003 | Kawakami et al. |
| 2009/0099799 A1 | 4/2009 | Barsoukov et al. |
| 2009/0155674 A1 | 6/2009 | Ikeda et al. |
| 2010/0188054 A1 | 7/2010 | Asakura et al. |
| 2010/0201321 A1 | 8/2010 | Asakura et al. |
| 2011/0077881 A1 | 3/2011 | Matsumura et al. |
| 2011/0148426 A1 | 6/2011 | Yokotani |
| 2012/0130661 A1 | 5/2012 | Hagimori et al. |
| 2014/0015488 A1* | 1/2014 | Despesse ............ H01M 10/441 429/7 |
| 2015/0002101 A1 | 1/2015 | Hasegawa et al. |
| 2015/0236533 A1 | 8/2015 | Yamamoto et al. |
| 2016/0036258 A1 | 2/2016 | Tsutsui |
| 2016/0054389 A1 | 2/2016 | Koba et al. |
| 2016/0061907 A1 | 3/2016 | Koba et al. |
| 2016/0089999 A1* | 3/2016 | Tabatowski-Bush ....................... H02J 7/0016 320/136 |
| 2016/0351976 A1 | 12/2016 | Kawahara et al. |
| 2017/0222447 A1 | 8/2017 | Ravi et al. |
| 2019/0011502 A1 | 1/2019 | Kobayashi et al. |
| 2020/0020924 A1 | 1/2020 | Takezawa et al. |
| 2020/0044473 A1 | 2/2020 | Katase et al. |
| 2020/0200834 A1 | 6/2020 | Uchino et al. |
| 2020/0313152 A1* | 10/2020 | Stefanopoulou .... H01M 50/578 |
| 2021/0126473 A1 | 4/2021 | Ikeda et al. |

FOREIGN PATENT DOCUMENTS

| | | |
|---|---|---|
| JP | 2001-86656 A | 3/2001 |
| JP | 2003-59544 A | 2/2003 |
| JP | 2009-043554 A | 2/2009 |
| JP | 2009-170397 A | 7/2009 |
| JP | 2011-76746 A | 4/2011 |
| JP | 2011-112453 A | 6/2011 |
| JP | 2011-135656 A | 7/2011 |
| JP | 2012-69405 A | 4/2012 |
| JP | 2012-115004 A | 6/2012 |
| JP | 2014-206441 A | 10/2014 |
| JP | 2014-206442 A | 10/2014 |

OTHER PUBLICATIONS

International Search Report (ISR) issued in PCT/JP2018/013637mailed in Jun. 2018. (Cited in the parent U.S. Appl. No. 16/810,506).
Written Opinion (PCT/ISA/237) issued in PCT/JP2018/013637mailed in Jun. 2018. (Cited in the parent U.S. Appl. No. 16/810,506).
Extended European Search Report dated Feb. 11, 2021, in a counterpart European U.S. Appl. No. 16/810,506. (Cited in the parent U.S. Appl. No. 16/810,506).
Chinese Office Action dated Aug. 9, 2021 in a counterpart Chinese patent application No. 201880059902.9. (A machine translation (not reviewed for accuracy) attached and cited in the parent U.S. Appl. No. 16/810,506).
Japanese Office Action dated Oct. 26, 2021 in a counterpart Japanese patent application No. 2019-542976. (A machine translation (not reviewed for accuracy) attached and cited in the parent U.S. Appl. No. 16/810,506).
Chinese Office Action dated Feb. 23, 2022 in a counterpart Chinese patent application No. 201880059902.9. (A machine translation (not reviewed for accuracy) attached and cited in the parent U.S. Appl. No. 16/810,506).
Japanese Office Action dated Apr. 5, 2022 in a counterpart Japanese patent application No. 2019-542976. (A machine translation (not reviewed for accuracy) attached and cited in the parent U.S. Appl. No. 16/810,506).
Pan Tao, "High-Performance Solar Cell Test System Based on Virtual instruments", Dynamic Energy Materials, vol. 38, pp. 1574-1576, 20071231 (Cited in the parent U.S. Appl. No. 16/810,506).
Kong Fanjian, "Testing of I-V characteristic curve of solar cell module", Proceedings of the 11th China Photovoltaic Congress and Exhibition Conference, pp. 958-965, 20110614 (Cited in the parent U.S. Appl. No. 16/810,506).
Li Yilong et al., "Photovoltaic Module Manufacturing Technology", Beijing Post University Press, p. 32, 20170831 (Cited in the parent U.S. Appl. No. 16/810,506).
Chinese Office Action dated May 27, 2022 in a counterpart Chinese patent application No. 201880059902.9. A machine translation (not

(56) References Cited

OTHER PUBLICATIONS reviewed for accuracy) attached and cited in the parent U.S. Appl. No. 16/810,506).

* cited by examiner

RECHARGEABLE BATTERY SHORT CIRCUIT EARLY DETECTION DEVICE AND RECHARGEABLE BATTERY SHORT CIRCUIT EARLY DETECTION METHOD

TECHNICAL FIELD

The present invention relates to a rechargeable battery short-circuit early detection device and a rechargeable battery short-circuit early detection method.

BACKGROUND ART

Rechargeable batteries installed in automobiles are configured by combining a plurality of cells to achieve a prescribed voltage. For example, in lead-acid batteries installed in automobiles, each cell has a voltage of approximately 2V, and six of these cells are connected in series to achieve a voltage of approximately 12V.

In these types of rechargeable batteries that are configured by combining a plurality of cells, repeated charging/discharging causes various changes to occur in each cell, which can sometimes result in short-circuits occurring within the rechargeable battery.

When a short-circuit occurs in such a rechargeable battery, the original output voltage of approximately 12V decreases to approximately 10V, and the rechargeable battery can no longer be used normally.

When a rechargeable battery with an internal short-circuit is charged under the same conditions as a rechargeable battery that is operating normally, the voltage applied to a single cell becomes higher than normal, which results in overcharging and problems such as temperature increases and production of hydrogen.

Accordingly, the technologies disclosed in Patent Documents 1 to 3 exist as technologies for detecting such short-circuits in rechargeable batteries.

Patent Document 1 discloses a technology in which a reference voltage relative to an integrated current value is stored and compared to a current detected voltage, and when the current detected voltage is less than the reference voltage, it is determined that an internal short-circuit is present in a battery cell.

Patent Document 2 discloses a technology which determines cell short-circuits using both a comparison between a reference voltage and a charging/discharging terminal voltage as well as a deterioration factor based on the time elapsed from when charging/discharging stopped, the stable OCV, and a relaxation function F(t).

Patent Document 3 discloses a technology in which a voltage at a time when the current flowing becomes less than or equal to a prescribed value is compared to a voltage at after a prescribed period of time since the current became less than or equal to the prescribed value has elapsed, and if the difference therebetween is greater than or equal to a prescribed value, a short-circuit is determined to be present.

RELATED ART DOCUMENTS

Patent Documents

Patent Document 1: Japanese Patent Application Laid-Open Publication No. 2011-135656
Patent Document 2: Japanese Patent Application Laid-Open Publication No. 2011-112453
Patent Document 3: Japanese Patent Application Laid-Open Publication No. 2009-170397

SUMMARY OF THE INVENTION

However, although the technologies disclosed in Patent Documents 1 to 3 as described above make it possible to detect that a short-circuit has occurred and progressed in a rechargeable battery, these technologies lack the ability to detect the occurrence of such short-circuits early.

The present invention was made in light of the foregoing and aims to provide a rechargeable battery short-circuit early detection device and a rechargeable battery early detection method that make it possible to detect the occurrence of short-circuits in a rechargeable battery early.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a rechargeable battery short-circuit early detection device that detects a short-circuit in a rechargeable battery that contains one or more battery cells, the device comprising one or more processors configured to be connected to a current sensor that detects a charging current of the rechargeable battery, wherein the one or more processors are programmed to: while the rechargeable battery is being charged, receive a current signal indicating the charging current from the current sensor; detect a temporal change in the charging current indicated by the current signal; determine, when the detected temporal change in the charging current indicates a prescribed abnormality, that there is a possibility that at least one of the cells of the rechargeable battery has short-circuited; and output a signal indicating the possibility that at least one of the cells of the rechargeable battery has short-circuited.

In the above-mentioned rechargeable battery short-circuit early detection device, the one or more processors may receive the current signal indicating the charging current from the current sensor while the rechargeable battery is being charged at a constant voltage.

In the above-mentioned rechargeable battery short-circuit early detection device, the prescribed abnormality may be that a temporal rate of increase in the charging current increases over a prescribed period of time.

In the above-mentioned rechargeable battery short-circuit early detection device, the prescribed abnormality may be that the charging current increases over a prescribed period of time.

In the above-mentioned rechargeable battery short-circuit early detection device, the one or more processors may be further configured to be connected to a voltage sensor that detects a charging voltage of the rechargeable battery, and the one or more processors may be further programed to: while the rechargeable battery is being charged, receive a voltage signal indicating the charging voltage from the voltage sensor, detect a temporal change in the charging voltage indicated by the voltage signal, determine, when the detected temporal change indicates that the charging voltage decreases over a prescribed period of time, that at least one of cells of the rechargeable battery has short-circuited and that the short-circuit has further progressed, and output a signal indicating the determination that at least one of cells of the rechargeable battery has short-circuited and that the short-circuit has further progressed.

In the above-mentioned rechargeable battery short-circuit early detection device, the one or more processors may receive the voltage signal indicating the charging voltage from the voltage sensor while the rechargeable battery is being charged at a constant current.

In the above-mentioned rechargeable battery short-circuit early detection device, upon determining that there is the possibility that at least one of cells of the rechargeable battery has short-circuited, the one or more processors may cause a warning to be outputted to an exterior and/or may cause charging of the rechargeable battery to be restricted.

In the above-mentioned rechargeable battery short-circuit early detection device, upon determining that at least one of cells of the rechargeable battery has short-circuited and that the short-circuit has further progressed, the one or more processors may cause a warning to be outputted to an exterior and/or may cause charging of the rechargeable battery to be terminated.

In the above-mentioned rechargeable battery short-circuit early detection device, the prescribed abnormality may be that the charging current has transitioned from decreasing over time to increasing over time.

In the above-mentioned rechargeable battery short-circuit early detection device, the one or more processors may be further programmed to: upon passing of a prescribed period of time after outputting the signal indicating the possibility that at least one of the cells of the rechargeable battery has short-circuited, newly detect a temporal change in the charging current, and determine whether the newly detected temporal change indicates that the prescribed abnormality persists; if the newly detected temporal change indicates that the prescribed abnormality persists, output a signal indicating a possibility that the short-circuit of the at least one of the cells of the rechargeable battery is progressing; and thereafter, cause charging of the rechargeable battery to be restricted.

In another aspect, the present disclosure provides an abnormality detection device for a rechargeable battery, the device comprising one or more processors configured to be connected to a current sensor that detects a charging current of the rechargeable battery, wherein the one or more processors are programmed to: while the rechargeable battery is being charged at a constant voltage, receive a current signal indicating the charging current from the current sensor; detect a temporal change in the charging current indicated by the current signal; determine whether the detected temporal change in the charging current indicates a prescribed abnormality; and if the detected temporal change indicates the prescribed abnormality, output a signal indicating the abnormality.

In another aspect, the present disclosure provides a rechargeable battery short-circuit early detection method that detects a short-circuit in a rechargeable battery that contains one or more battery cells, the method being executed by one or more processors configured to be connected to a current sensor that detects a charging current of the rechargeable battery, the method comprising the above-enumerated various processes the one or more processors are programed to perform.

In another aspect, the present disclosure provides a rechargeable battery short-circuit early detection device that detects a short-circuit in a rechargeable battery that has an electrolyte and contains one or more battery cells, the device comprising one or more processors configured to be connected to a current sensor that detects a charging current of the rechargeable battery, wherein the one or more processors are programmed to: determine whether or not the rechargeable battery is being charged with a constant voltage; detect a temporal slope of the charging current if the one or more processors determine that the rechargeable battery is being charged with the constant voltage; if the detected temporal slope of the charging current exceeds a first threshold, determine that there is a possibility that a short circuit has occurred in at least one of the cells of the rechargeable battery and output a signal indicating said possibility; when the one or more processors determine that there is the possibility that at least one of the cells of the rechargeable battery has short-circuited, detect anew a temporal slope of the charging current after a prescribed period of time has elapsed since the determination of said possibility; and thereafter, if the anew detected temporal slope of the charging current exceeds a second threshold that is greater than the first threshold, determine that there is a possibility that the short-circuit is progressing, and output a signal indicating said possibility.

In another aspect, the present disclosure provides a rechargeable battery short-circuit early detection device that detects a short-circuit in a rechargeable battery that has an electrolyte and contains one or more battery cells, the device comprising one or more processors configured to be connected to a current sensor that detects a charging current of the rechargeable battery and to a temperature sensor detecting a temperature of the electrolyte or a temperature of a surrounding environment of the rechargeable battery, wherein the one or more processors are programmed to: while the rechargeable battery is being charged, monitor the charging current detected by the current sensor and the temperature detected by the temperature sensor so as to produce a plurality of charging current values as a function of time; convert each of the plurality of charging current values detected by the current sensor when a temperature of the electrolyte differs from a reference temperature to a converted charging current value in a reference state of the electrolyte that is at the reference temperature in accordance with the temperature of the electrolyte at which the charging current value is detected, thereby producing a plurality of the converted charging current values, the temperature of the electrolyte being detected by the temperature sensor or being estimated by the one or more processors from the temperature of the surrounding environment detected by the temperature sensor; detect a temporal slope of the plurality of converted charging current values when the one or more processors determine that the rechargeable battery is being charged with a constant voltage; if the detected temporal slope of the plurality of converted charging current values exceeds a first threshold, determine that there is a possibility that a short circuit has occurred in at least one of the cells of the rechargeable battery and output a signal indicating said possibility; when the one or more processors determine that there is the possibility that at least one of the cells of the rechargeable battery has short-circuited, detect anew a temporal slope of the plurality of converted charging current values after a prescribed period of time has elapsed since the determination of said possibility; and thereafter, if the anew detected temporal slope of the plurality of converted charging current values exceeds a second threshold that is greater than the first threshold, determine that there is a possibility that the short-circuit is progressing, and output a signal indicating said possibility.

In another aspect, the present disclosure provides a rechargeable battery short-circuit early detection method that detects a short-circuit in a rechargeable battery that has an electrolyte and contains one or more battery cells, the method being executed by one or more processors configured to be connected to a current sensor that detects a charging current of the rechargeable battery and to a temperature sensor detecting a temperature of the electrolyte or a temperature of a surrounding environment of the rechargeable battery, the method comprising: while the rechargeable battery is being charged, monitoring the charging current detected by the current sensor and the temperature detected by the temperature sensor so as to produce a plurality of charging current values as a function of time; converting each of the plurality of charging current values detected by the current sensor when a temperature of the electrolyte differs from a reference temperature to a converted charging current value in a reference state of the electrolyte that is at the reference temperature in accordance with the temperature of the electrolyte at which the charging current value is detected, thereby producing a plurality of the converted charging current values, the temperature of the electrolyte being detected by the temperature sensor or being estimated by the one or more processors from the temperature of the surrounding environment detected by the temperature sensor; detecting a temporal slope of the plurality of converted charging current values when the rechargeable battery is being charged with a constant voltage; if the detected temporal slope of the plurality of converted charging current values exceeds a first threshold, determining that there is a possibility that a short circuit has occurred in at least one of the cells of the rechargeable battery and outputting a signal indicating said possibility; when it is determined that there is the possibility that at least one of the cells of the rechargeable battery has short-circuited, detecting anew a temporal slope of the plurality of converted charging current values after a prescribed period of time has elapsed since the determination of said possibility; and thereafter, if the anew detected temporal slope of the plurality of converted charging current values exceeds a second threshold that is greater than the first threshold, determining that there is a possibility that the short-circuit is progressing, and outputting a signal indicating said possibility.

It is to be understood that both the foregoing general description and the following detailed description are exemplary and explanatory, and are intended to provide further explanation of the invention as claimed.

The present invention makes it possible to provide a rechargeable battery short-circuit early detection device and a rechargeable battery short-circuit early detection method that can detect the occurrence of short-circuits in a rechargeable battery early.

DETAILED DESCRIPTION OF EMBODIMENTS

Next, embodiments of the present invention will be described.

(A) Description of Configuration of Embodiment of Present Invention

Figure 1:
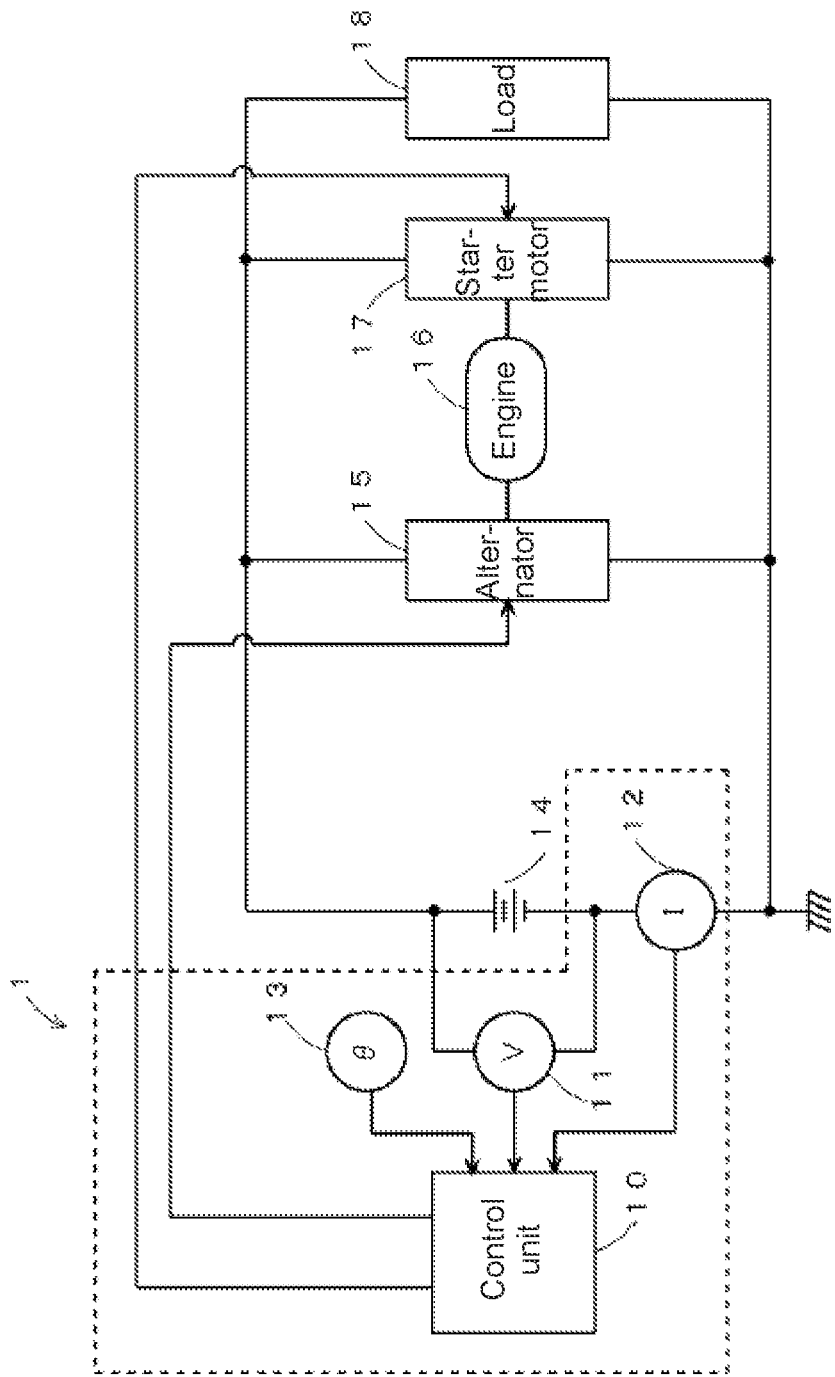
FIG. 1 illustrates an example configuration of a rechargeable battery short-circuit early detection system/device according to an embodiment of the present invention.

FIG. 1 illustrates a vehicle power supply system having a rechargeable battery short-circuit early detection system/device according to an embodiment of the present invention. In this figure, a rechargeable battery short-circuit early detection system/device 1 primarily includes a controller 10, a voltage sensor 11, a current sensor 12, and a temperature sensor 13 and detects the occurrence of short-circuits in a rechargeable battery 14 early. Moreover, at least one of the voltage sensor 11, the current sensor 12, and the temperature sensor 13 may be configured as a separate component, and detection signals therefrom may be taken as input.

Here, the controller 10 references the outputs of the voltage sensor 11, the current sensor 12, and the temperature sensor 13 to detect the state of the rechargeable battery 14 and controls the state of charge of the rechargeable battery 14 by controlling a voltage generated by an alternator 15. The voltage sensor 11 detects the terminal voltage of the rechargeable battery 14 and reports this voltage to the controller 10 as a voltage signal. The current sensor 12 detects the current flowing through the rechargeable battery 14 and reports this current to the controller 10 as a current signal. The temperature sensor 13 detects the temperature of the electrolyte or surrounding environment of the rechargeable battery 14 and reports this temperature to the controller 10 as a temperature signal. Note that rather than the controller 10 controlling the state of charge of the rechargeable battery 14 by controlling the voltage generated by the alternator 15, an electronic control unit (ECU; not illustrated in the figure) may control the state of charge, for example.

The rechargeable battery 14 is a rechargeable battery having an electrolyte, such as a lead-acid battery, a nickel-cadmium battery, or a nickel-metal hydride battery, for example; is charged by the alternator 15; powers a starter motor 17 to start an engine; and supplies power to a load 18. The alternator 15 is powered by an engine 16, generates AC power and converts that AC power to DC power via a rectifier circuit, and charges the rechargeable battery 14. The alternator 15 is controlled by the controller 10, and the voltage generated can be adjusted.

The engine 16 is a reciprocating engine or rotary engine such as a gasoline engine or diesel engine, for example, is started by the starter motor 17, drives drive wheels via a transmission to supply propulsive power to the vehicle, and also drives the alternator 15 to make the alternator 15 generate electrical power. The starter motor 17 is a DC motor, for example, and generates a rotational force using electrical power supplied from the rechargeable battery 14 to start the engine 16. The load 18 is a power steering motor, a defogger, a seat heater, an ignition coil, a car audio system, a car navigation unit, or the like, for example, and runs on electrical power from the rechargeable battery 14.

Figure 2:
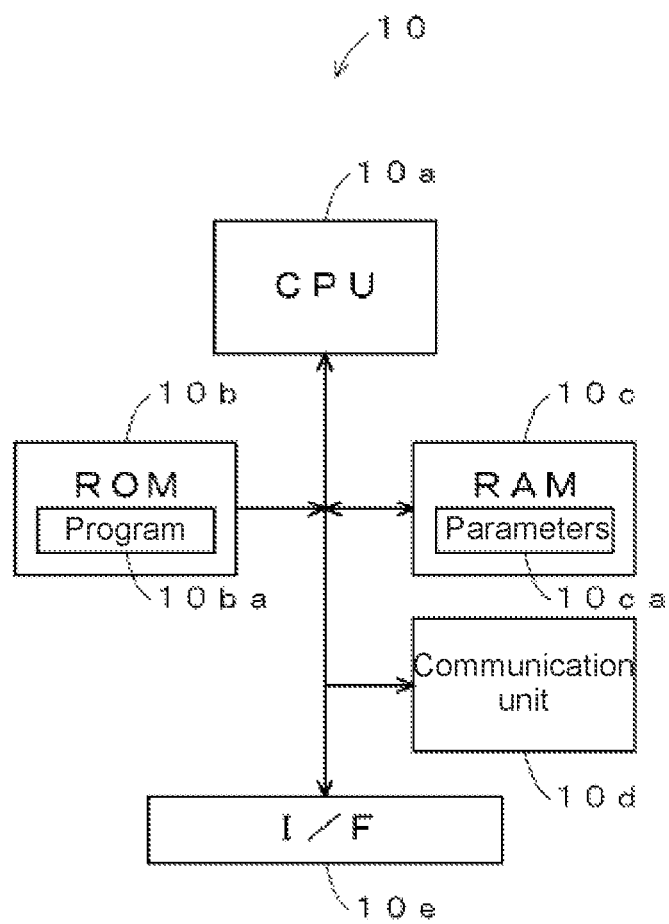
FIG. 2 is a block diagram illustrating a detailed configuration example for the controller in FIG. 1.

FIG. 2 illustrates a detailed example configuration for the controller 10 illustrated in FIG. 1. As illustrated in the figure, the controller 10 includes a central processing unit (CPU) 10a, a read-only memory (ROM) 10b, a random-access memory (RAM) 10C, a communication unit 10d, and an interface (I/F) 10e. Here, the CPU 10a controls the other components according to a program 10ba stored in the ROM 10b. The ROM 10b is semiconductor memory or the like and stores the program 10ba and the like. The RAM 10c is semiconductor memory or the like and stores data generated when executing the program 10ba or parameters 10ca such as a table (described later). The communication unit 10d communicates with upstream devices such as an electronic control unit (ECU) and sends detected information or control information to the upstream devices. The I/F 10e converts signals supplied by the voltage sensor 11, the current sensor 12, and the temperature sensor 13 to digital signals and takes these digital signals as input and also controls the alternator 15, the starter motor 17, and the like by supplying drive current thereto. Note that although in the example in FIG. 2 the configuration includes the CPU 10a as a processor, a digital signal processor (DSP) or field-programmable gate array (FPGA) may be included. Moreover, rather than including a single processor, a plurality of these processors may be included.

(B) Description of Operation of Embodiment of Present Invention

Next, the operation of embodiments of the present invention will be described. Note that below, after describing the principle of operation of the embodiments of the present invention, the detailed operation will be described.

First, the principle of operation of the embodiments of the present invention will be described. While charging the rechargeable battery 14, when the state of charge (SOC) of the rechargeable battery 14 is low (less than 90%, for example), the alternator 15 charges the rechargeable battery 14 at a constant current (constant-current charging). Here, this charging current can have a magnitude on the order of several dozen A to several hundred A, for example. The charging current may also be greater than or less than this, of course.

Figure 3A:
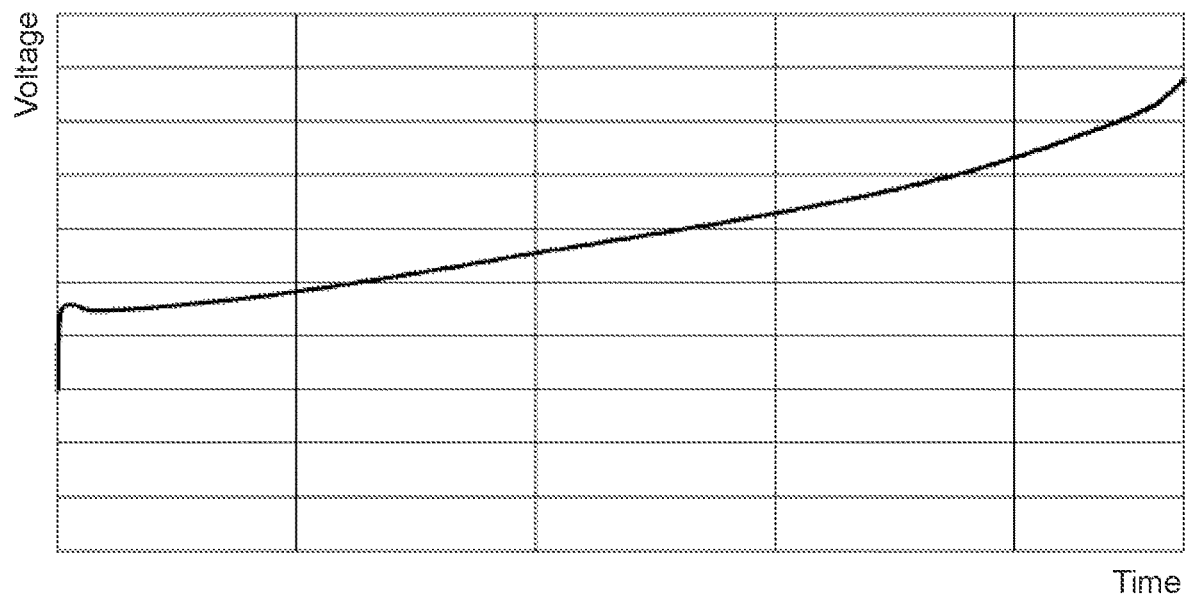
FIGS. 3A-3B illustrate temporal changes in voltage and current when a rechargeable battery that is operating normally is charged at constant current.
Figure 3B:
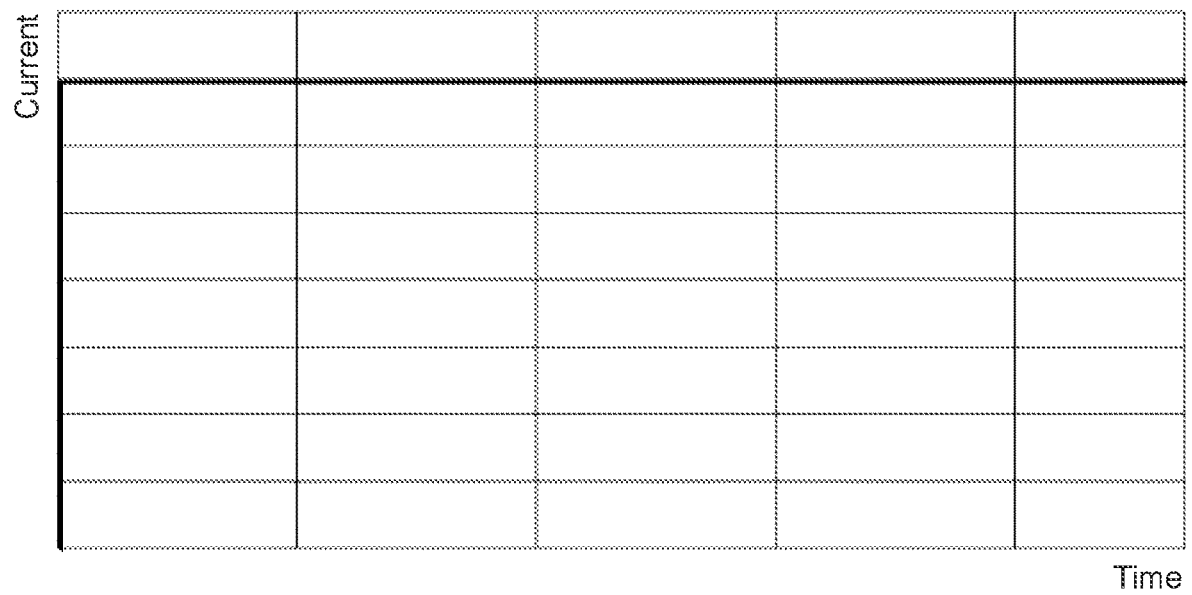

FIGS. 3A-3B illustrate the temporal changes in voltage and current during constant-current (CC) charging when the rechargeable battery 14 is operating normally (when no short-circuits have occurred). More specifically, FIG. 3A shows the temporal change in the terminal voltage of the rechargeable battery 14 during constant-current charging, and FIG. 3B shows the temporal change in the current flowing through the rechargeable battery 14 during constant-current charging. As illustrated in FIG. 3B, during constant-current charging the current flowing through the rechargeable battery 14 is constant. Meanwhile, as illustrated in FIG. 3A, the terminal voltage of the rechargeable battery 14 increases over time.

Figure 4A:
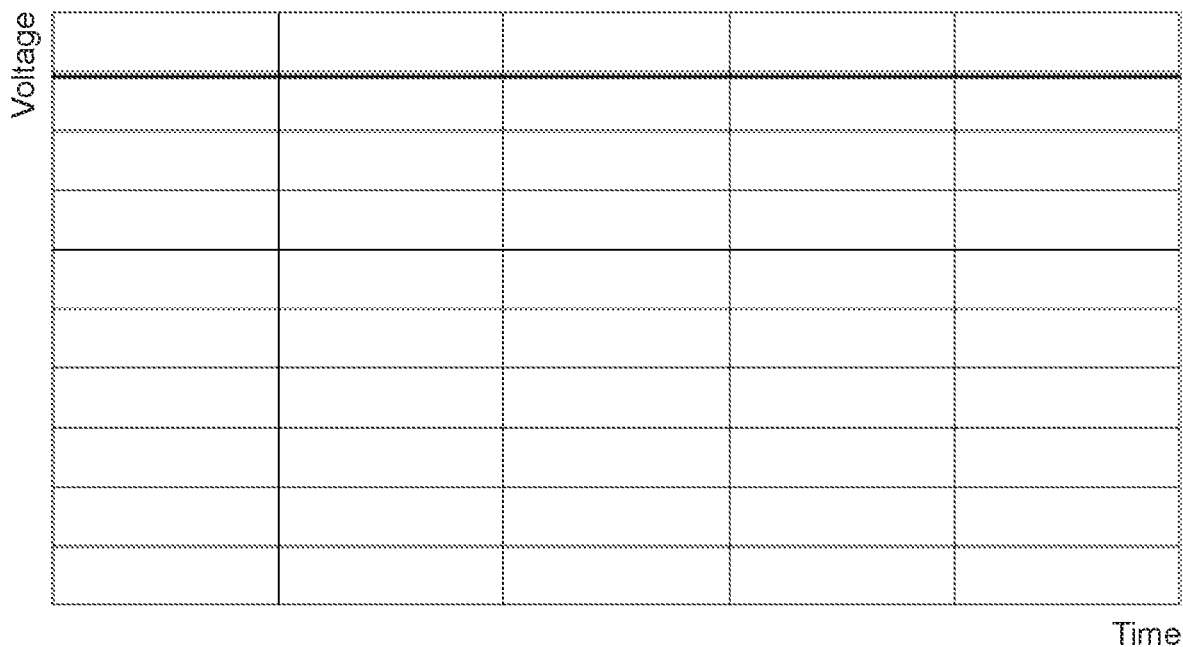
FIGS. 4A-4B illustrate temporal changes in voltage and current when a rechargeable battery that is operating normally is charged at constant voltage.
Figure 4B:
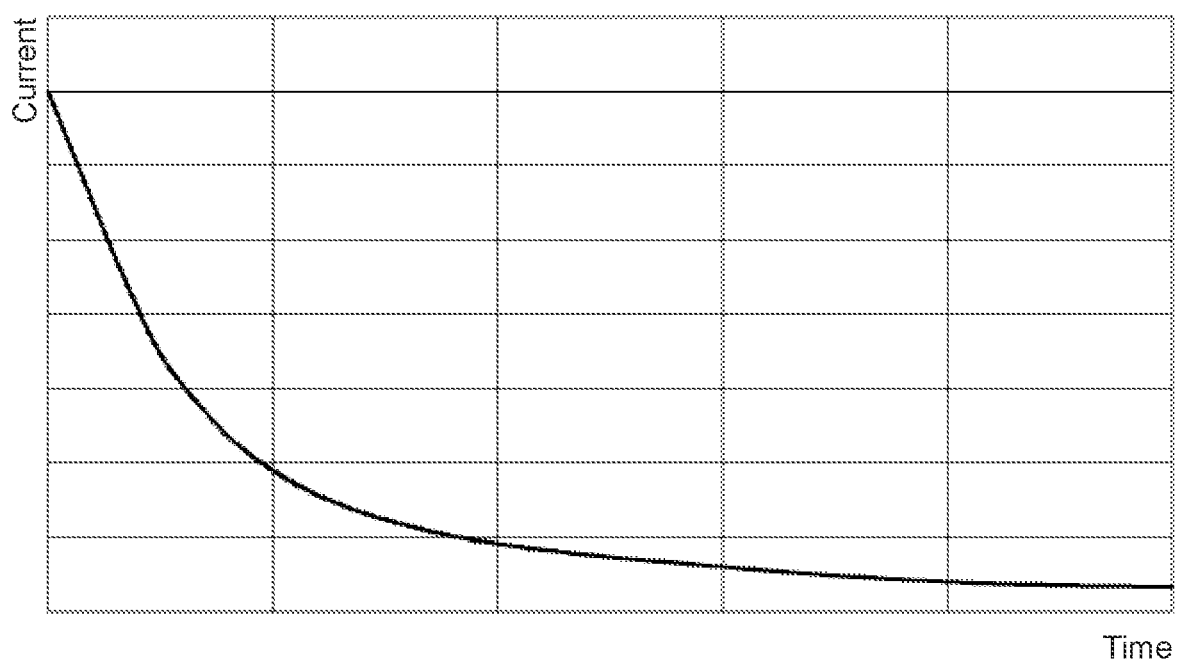

Then, when the SOC of the rechargeable battery 14 becomes high (greater than or equal to 90%, for example), the rechargeable battery 14 is switched to constant-voltage (CV) charging. FIGS. 4A-4B illustrate the changes in voltage and current during such constant-voltage charging. More specifically, FIG. 4A shows the temporal change in the terminal voltage of the rechargeable battery 14 during constant-voltage charging, and FIG. 4B shows the temporal change in the current flowing through the rechargeable battery 14 during constant-voltage charging. As illustrated in FIG. 4A, during constant-voltage charging the terminal voltage of the rechargeable battery 14 is constant. Meanwhile, as illustrated in FIG. 4B, the current flowing through the rechargeable battery 14 decreases as the SOC increases over time. Then, when the SOC becomes 100% the current takes a value close to zero. Here, as one example, if the output voltage of the alternator 15 is 14.4V, this voltage is applied uniformly to each of six cells in the rechargeable battery 14, and therefore a voltage of 2.4V (=14.4V/6) is applied to each cell.

Figure 5A:
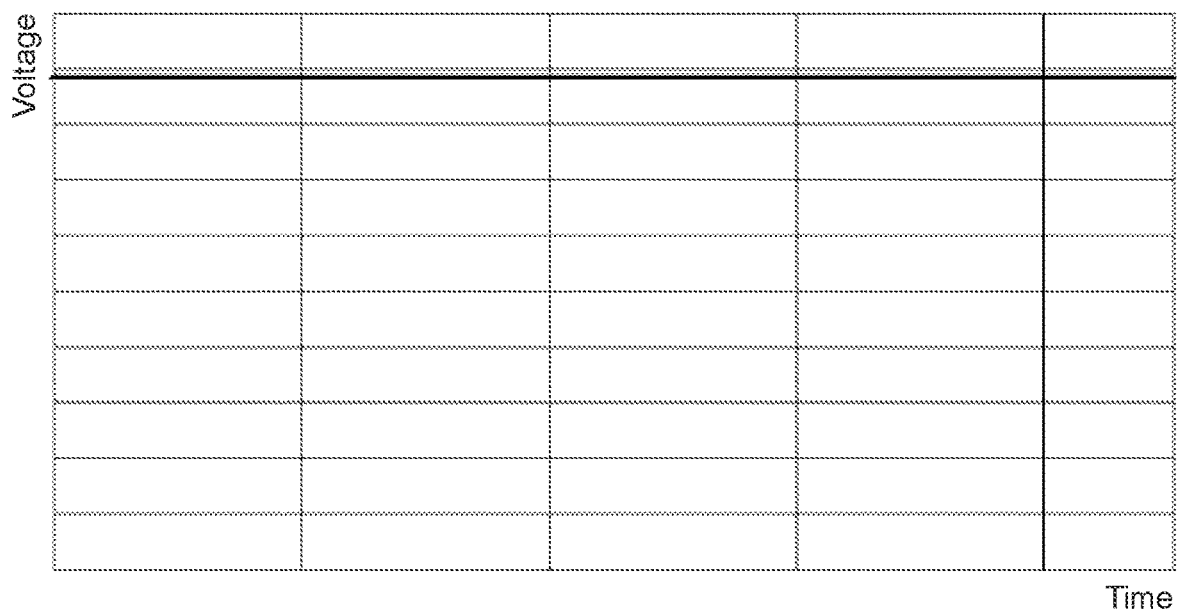
FIGS. 5A-5B illustrate temporal changes in voltage and current when a rechargeable battery in which a short-circuit is developing is charged at constant voltage.
Figure 5B:
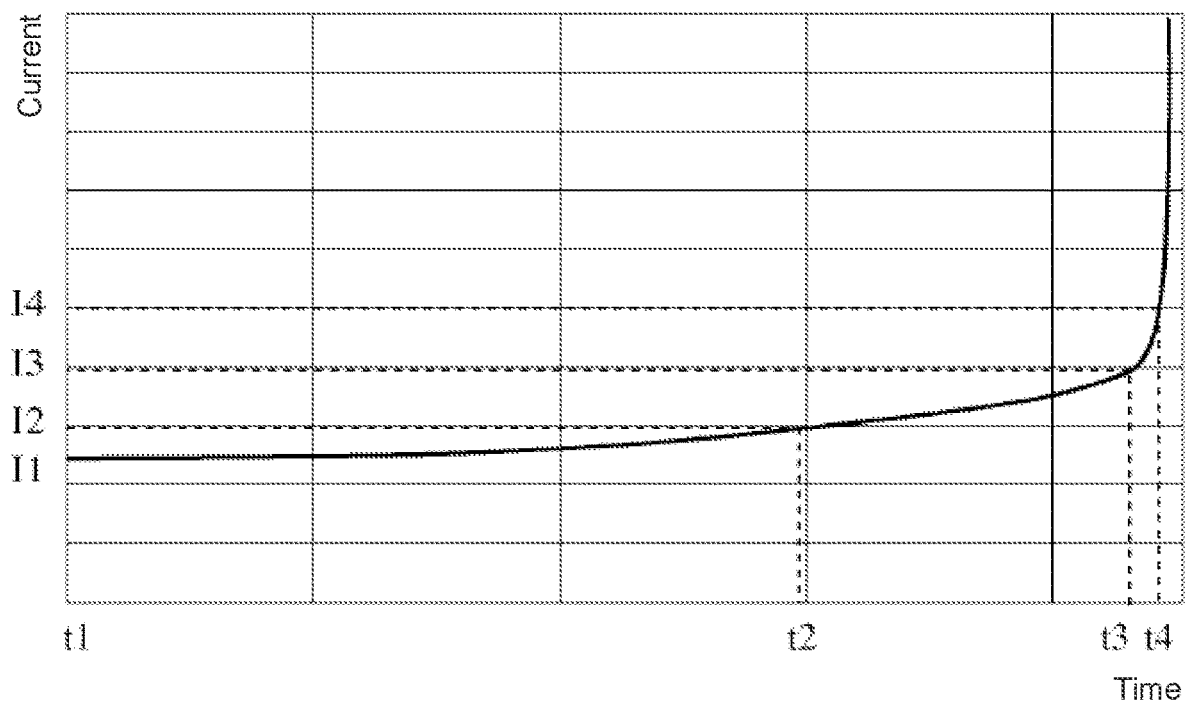

FIGS. 5A-5B illustrate the changes in voltage and current when a short-circuit occurs in the rechargeable battery 14 while the rechargeable battery 14 is undergoing constant-voltage charging. More specifically, FIG. 5A shows the temporal change in the terminal voltage of the rechargeable battery 14 during constant-voltage charging, and FIG. 5B shows the temporal change in the current flowing through the rechargeable battery 14 during constant-voltage charging. Note that in FIGS. 5A-5B, the short-circuit progresses rapidly starting from near times t3 and t4. As illustrated in FIG. 5A, during constant-voltage charging the terminal voltage of the rechargeable battery 14 is constant. However, although when operating normally the current flowing through the rechargeable battery 14 decreases over time as illustrated in FIG. 4B, in the example in FIG. 5B, the current increases over time and increases rapidly from times t3 and t4 and on. Note that in FIGS. 5A-5B, I1 is on the order of approximately 0.5 to 0.6 A, and 14 is on the order of approximately 1.2 A. Moreover, the time from time t1 to t4 is approximately 20 to 30 hours, the time from time t2 to t3 is approximately several hours, and the time from time t3 to t4 is on the order of approximately 30 minutes to an hour. The example time periods given above are different depending on the type of rechargeable battery 14 and the state of progress of the short-circuit, of course.

Here, when a short-circuit occurs in any of the cells of the rechargeable battery 14, the output voltage of that cell approaches 0V, and therefore the voltage applied to the other cells increases as a result. Thus, as illustrated in FIG. 5B, the charging current increases rapidly. If the alternator 15 or the like has a feature for implementing restrictions when the current exceeds a prescribed value (or if there is an upper limit on current supply capacity), the current from the alternator 15 becomes constant, which results in a transition to substantially constant-current charging.

Figure 6A:
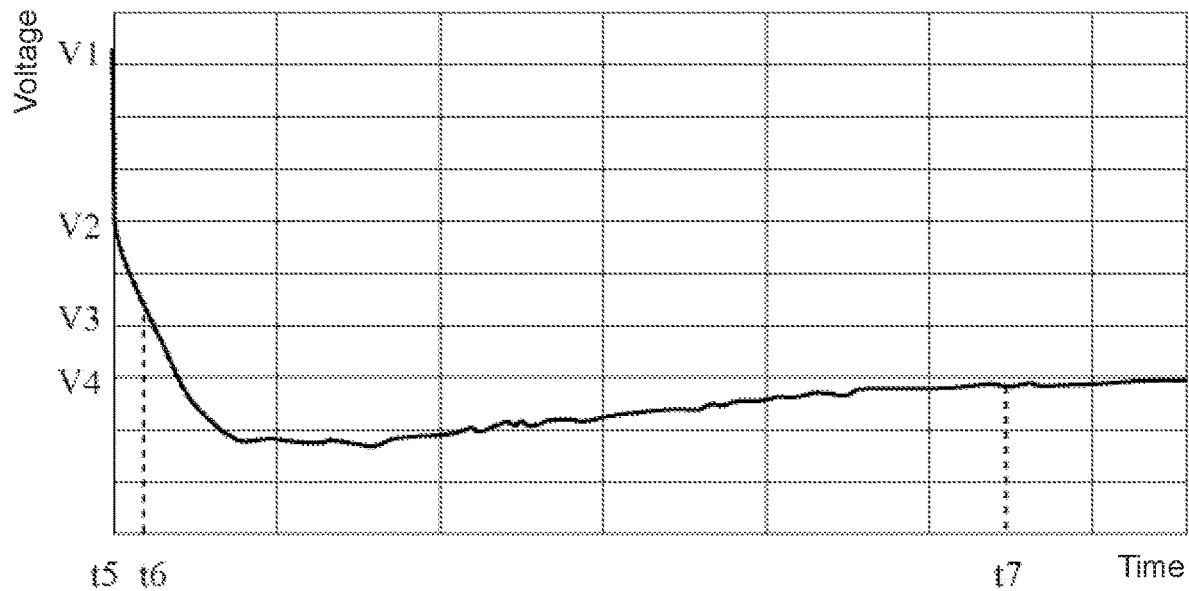
FIGS. 6A-6B illustrate temporal changes in voltage and current when a rechargeable battery in which a short-circuit has occurred is charged at constant current.
Figure 6B:
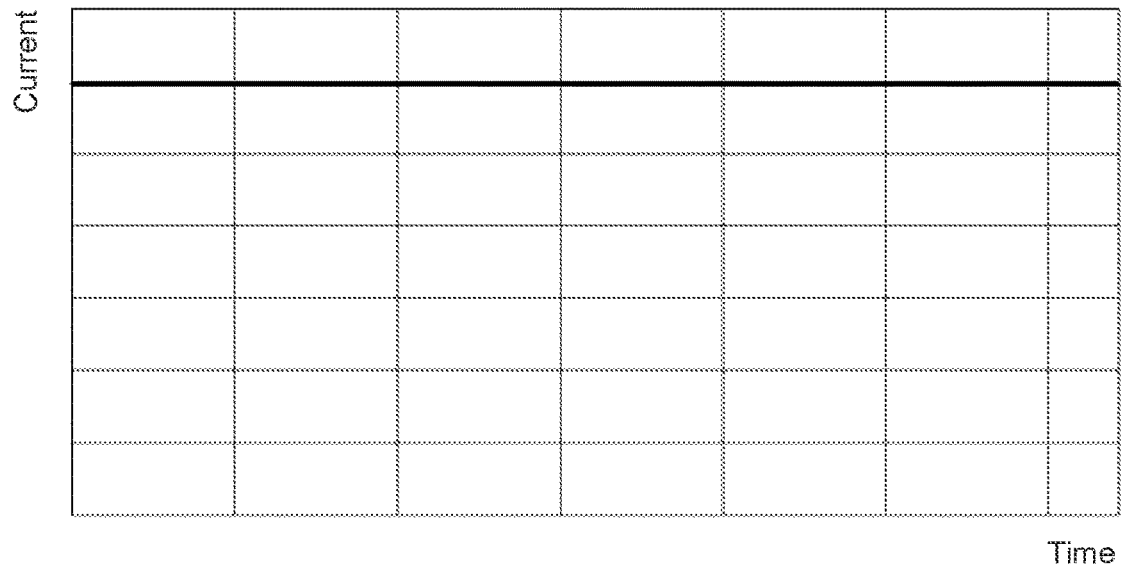

FIGS. 6A-6B illustrate the temporal changes in voltage and current upon transitioning to constant-current charging after a short-circuit has occurred. More specifically, FIG. 6A shows the temporal change in voltage after the short-circuit has occurred, and FIG. 6B shows the temporal change in current after the short-circuit has occurred. As illustrated in FIG. 6B, upon transitioning to constant-current charging the current flowing through the rechargeable battery 14 becomes constant. Moreover, as illustrated in FIG. 6A, upon transitioning to constant-current charging when a short-circuit has occurred, immediately after the short-circuit occurs the voltage of the rechargeable battery 14 decreases rapidly, and then as charging progresses the voltage increases gradually and begins to approach a prescribed voltage.

More particularly, if a short-circuit occurs in one cell of the six cells of the rechargeable battery 14, for example, the current increases in response to a voltage increase in each normal cell. If the alternator 15 or the like has a feature for implementing restrictions on current (or if there is an upper limit on current supply capacity), once the current exceeds a prescribed value the current is restricted to be constant, which results in a transition to substantially constant-current charging. When the constant-current charging continues, the voltage increases due to an increase in sulfate concentration in the electrolyte. Then, once the amount of lead sulfate contained in the electrode plates becomes small, the voltage increases rapidly due to hydrogen and oxygen overvoltage, thus causing electrolysis of water, and the voltage becomes substantially constant (at 2.75V per cell, for example).

Therefore, letting the voltage of one cell of the rechargeable battery 14 be Vc, the number of short-circuited cells be n, and the number of cells in the rechargeable battery 14 be N, when the terminal voltage V takes a voltage close to V=(N−n)×Vc or a voltage slightly greater than that during constant-current charging, it can be determined that a short-circuit has occurred. For example, in an automobile, when a rechargeable battery 14 in which the number of cells N=6 is charged at 14.4V, then Vc=2.4V, and so if one cell short-circuits the terminal voltage V becomes equal to (6−1× 2.4=12.0V or takes a voltage slightly greater than that (approximately 13.6V, for example). In other words, in an automobile, if after transitioning from constant-voltage charging to constant-current charging the terminal voltage V becomes equal to 12.0V or takes a voltage slightly greater than that, it can be determined that a short-circuit has occurred in one cell. Note that in FIGS. 6A-6B, V1 is the voltage for when six cells are operating normally and is thus approximately 2.4V×6=14.4V. The calculation described above for when a short-circuit occurs in one cell would be 2.4V×5=12.0V, but because as illustrated in FIG. 5B the current increases due to the occurrence of the short-circuit, the voltage becomes slightly greater than 12.0V as a result (approximately 13.6V, for example, as described above). Then, as charging progresses and the amount of lead sulfate contained in the electrode plates becomes small, after the voltage rapidly increases due to hydrogen and oxygen overvoltage, electrolysis of water occurs and the per-cell voltage Vc approaches 2.75V. Therefore, as illustrated in FIG. 6A, when a short-circuit occurs in one cell, the terminal voltage V begins to approach V4 (=2.75V×5=13.75V) as time elapses.

In the present embodiment, the occurrence of a short-circuit is detected early by detecting the current increase illustrated in FIGS. 5A-5B corresponding to when a short-circuit occurs, and the occurrence of a short-circuit is detected by detecting the voltage decrease the illustrated in FIGS. 6A-6B.

Here, one possible cause for the change illustrated in FIGS. 5A-5B to occur is as follows. In other words, for a lead-acid battery that is the rechargeable battery, the chemical changes that occur at the electrodes during charging and discharging are as follows.

<Charging>

Positive electrode:Lead sulfate($PbSO_4$)→Lead dioxide($PbO_2$)

Negative electrode: Lead sulfate ($PbSO_4$)→Lead (Pb)

<Discharging>

Positive electrode: Lead dioxide ($PbSO_2$)→Lead sulfate ($PbSO_4$)

Negative electrode: Lead (Pb)→Lead sulfate ($PbSO_4$)

Here, lead sulfate has low conductivity, is difficult to dissolve in water, and has large volume (low specific gravity) in comparison to lead and lead dioxide. This lead sulfate is produced during discharge and accumulates on the positive and negative electrode plates but sometimes peels off due to vibrations or the like as the vehicle is traveling and bridges between the positive electrodes and negative electrodes. In other cases, lead sulfate crystals can form depending on the usage conditions of the rechargeable battery 14 (for example, when overdischarged or when the total amount of time spent in the discharged state is large), and these lead sulfate crystals sometimes bridge between the positive electrodes and negative electrodes.

Thus, when lead sulfate bridges between the positive electrodes and negative electrodes, because the lead sulfate has low conductivity as described above, short-circuits and the like do not occur immediately. However, in such states, charging causes the lead sulfate to gradually change into lead dioxide or lead, which are conductive. Therefore, it is conceivable that, as illustrated in FIG. 5B, current gradually increases starting from before a short-circuit occurs, and then once the short-circuit occurs, a large current flows. Note that although the above is only a hypothesis due to the difficulty of observing the phenomenon that is actually occurring within the rechargeable battery 14, the fact that current changes of the type illustrated in FIGS. 5A-5B do occur when a short-circuit occurs has been confirmed in actual measurements.

Next, the operation of embodiments of the present invention will be described in more detail. When the SOC of the rechargeable battery 14 is less than 90%, for example, the controller 10 controls the alternator 15 to perform constant-current charging. Thus, as charging progresses the voltage increases as illustrated in FIG. 3A.

When the SOC of the rechargeable battery 14 becomes greater than or equal to 90%, for example, the controller 10 controls the alternator 15 to transition to constant-voltage charging. While performing constant-voltage charging, the controller 10 uses the current sensor 12 to detect the current (charging current) flowing through the rechargeable battery 14 and detects temporal changes in this current. In other words, letting the charging current detected at a given point in time be I1 and the charging current detected after a prescribed period of time $\Delta T$ has elapsed be I2, $A=(I2-I1)/\Delta T$ is calculated as the temporal slope A of the current.

Thus, when the calculated A is a negative value, this corresponds to the current decreasing as illustrated in FIG. 4B, and therefore it can be determined that the rechargeable battery 14 is operating normally.

Meanwhile, when the calculated A is a positive value, this corresponds to the current increasing as illustrated in FIG. 5B, and therefore it can be determined that a short-circuit may be occurring in the rechargeable battery 14. Note that in order to avoid incorrect determinations due to measurement error or the like, this determination may be made on the basis of several measurement results or this determination may be made on the basis of the average value of several measurements, for example.

When the calculated A has a positive value, it is determined that there is a possibility that a short-circuit has occurred in the rechargeable battery 14, and this information is conveyed to the user of the vehicle, for example.

Next, after a prescribed period of time has elapsed, the current flowing through the rechargeable battery 14 is detected and the slope A of the current is calculated on the basis of the detection results in the same manner as described above. Then, if the calculated slope A of the current is still a positive value or if the slope A of the current has increased, it is determined that there is a possibility that a short-circuit is progressing, this information is conveyed to the user, and in order to prevent adverse effects to the battery, restrictions are implemented on charging of the rechargeable battery 14, for example. For example, during constant-voltage charging the alternator 15 is controlled to set the charging voltage to lower than normal.

If the short-circuit further progresses even after such implementing such control, the current increases rapidly as illustrated in FIG. 5B, and the alternator 15 reaches a maximum current and transitions to substantially constant-current charging. In this case, the terminal voltage decreases as illustrated in FIG. 6A, and therefore upon detecting such a decrease in charging voltage, the controller 10 determines that a short-circuit has further progressed and terminates charging. More specifically, in FIG. 6A the time from time t5 to t6 is approximately several minutes and the time from time t6 to t7 is approximately 1 day, and therefore these time periods are taken into account in detecting occurrence of short-circuits. This makes it possible to prevent the rechargeable battery 14 from generating heat or suffering damage.

As described above, in the embodiments of the present invention short-circuits in the rechargeable battery 14 are detected from temporal changes in current during constant-voltage charging, which makes it possible to detect such short-circuits sufficiently in advance and then notify the user or implement restrictions on charging, for example.

Moreover, in the embodiments of the present invention, when a short-circuit occurs, the occurrence of the short-circuit is detected from temporal changes in voltage and then the user is notified or restrictions are implemented on charging, for example, thereby making it possible to prevent further damage to the rechargeable battery 14.

Next, processes executed in the embodiments of the present invention will be described in detail with reference to FIGS. 7 to 9.

Figure 7:
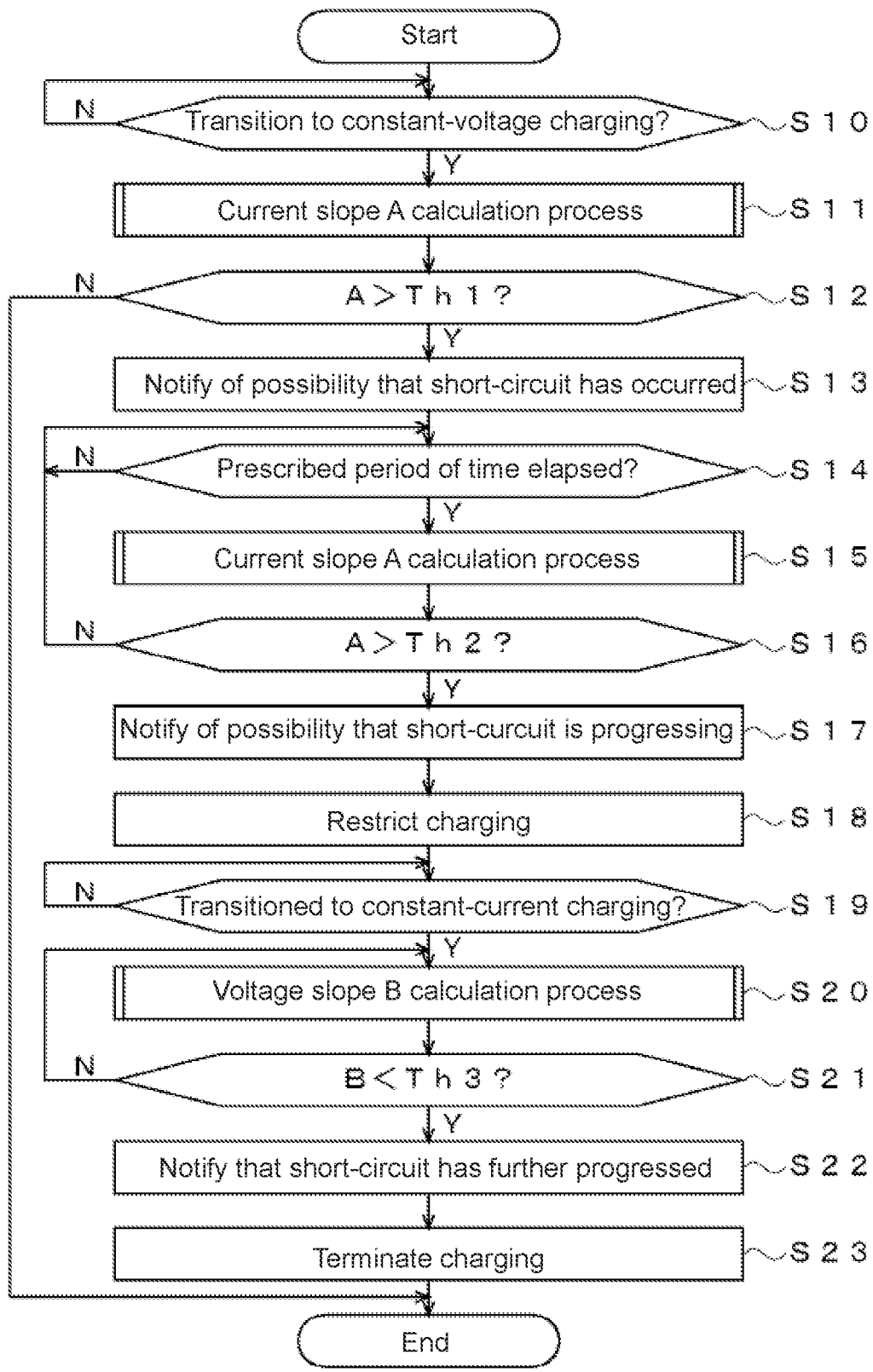
FIG. 7 is a flowchart for explaining the operation of embodiments of the present invention.

FIG. 7 is a flowchart for explaining an example of a process that is executed in the embodiments of the present invention. Once the flowchart illustrated in FIG. 7 is started, the following steps are executed.

In step S10, the CPU 10a of the controller 10 determines whether to transition to constant-voltage charging. Upon determining to transition to constant-voltage charging (Y in step S10), the CPU 10a proceeds to step S11, and otherwise, the CPU 10a continues to repeat the same process. For example, when the SOC of the rechargeable battery 14 becomes greater than or equal to 90%, the CPU 10a determines to transition to constant-voltage charging and proceeds to step S11.

In step S11, the CPU 10a executes a process of calculating the temporal slope A of the current flowing from the alternator 15 to the rechargeable battery 14. The details of this process will be described later with reference to FIG. 8.

In step S12, the CPU 10a determines whether the slope A calculated in step S11 is greater than a prescribed threshold value Th1. Upon determining that A>Th1 (where Th1≥0) (Y in step S12), the CPU 10a proceeds to step S13, and otherwise (N in step S12), the CPU 10a ends the process. Here, the value of Th1 can be set to an appropriate value on the basis of the type of rechargeable battery 14 or the length of ΔT, for example.

Then the CPU outputs a signal indicating the above-described abnormality. For example, in step S13, the CPU 10a outputs a signal to the communication unit 10d so as to notify the user of the possibility of occurrence of a short-circuit. More specifically, by notifying upstream devices via the communication unit 10d, the user can be warned via audio, text, or the like of the possibility that a short-circuit may occur in the rechargeable battery 14.

In step S14, the CPU 10a determines whether a prescribed period of time has elapsed. Upon determining that the prescribed period of time has elapsed (Y in step S14), the CPU 10a proceeds to step S15, and otherwise (N in step S14), the CPU 10a continues to repeat the same process. For example, if several hours have elapsed from when a determination of Y was obtained in step S12, the CPU 10a determines Y and proceeds to step S15. Here, this period of time can be set to an appropriate value on the basis of the type of rechargeable battery 14 or the like.

In step S15, the CPU 10a executes the process of calculating the temporal slope A of the current flowing from the alternator 15 to the rechargeable battery 14. The details of this process will be described later with reference to FIG. 8.

In step S16, the CPU 10a determines whether the slope A calculated in step S15 is greater than a prescribed threshold value Th2 (where Th2>Th1). Upon determining that A>Th2 (Y in step S16), the CPU 10a proceeds to step S17, and otherwise (N in step S16), the CPU 10a returns to step S14 and repeats the same process as described above. Here, the value of Th2 can be set to an appropriate value on the basis of the type of rechargeable battery 14 or the length of ΔT, for example.

In step S17, the CPU 10a notifies the user via the communication unit 10d that there is a possibility that the short-circuit is progressing. More specifically, by notifying upstream devices via the communication unit 10d, the user can be informed via audio, text, or the like that occurrence of a short-circuit in the rechargeable battery 14 is imminent.

In step S18, the CPU 10a controls the alternator 15 to implement restrictions on charging. More specifically, the CPU 10a controls the alternator 15 to reduce the voltage generated thereby and thereby restricts charging. This makes it possible to prevent adverse effects on the battery that would otherwise occur due to overcharging of normal cells, thereby making it possible to inhibit progression of the short-circuits.

In step S19, the CPU 10a determines whether a transition to constant-current charging has occurred. Upon determining that a transition to constant-current charging has occurred (Y in step S19), the CPU 10a proceeds to step S20, and otherwise, the CPU 10a continues to repeat the same process. For example, when an excessive current has flowed through the rechargeable battery 14 due to a short-circuit, the CPU 10a determines that a transition to constant-current charging has occurred and proceeds to step S20.

In step S20, the CPU 10a executes a process of calculating the temporal slope B of the voltage applied to the rechargeable battery 14 by the alternator 15. The details of this process will be described later with reference to FIG. 9.

In step S21, the CPU 10a determines whether the slope B calculated in step S20 is less than a prescribed threshold value Th3. Upon determining that B<Th3 (where Th3≤0) (Y in step S21), the CPU 10a proceeds to step S22, and otherwise (N in step S21), the CPU 10a continues to repeat the same process. Here, the value of Th3 can be set to an appropriate value on the basis of the type of rechargeable battery 14 or the length of ΔT, for example.

In step S22, the CPU 10a notifies the user via the communication unit 10d that the short-circuit has further progressed. More specifically, by notifying upstream devices via the communication unit 10d, the user can be informed via audio, text, or the like that a short-circuit has further progressed in the rechargeable battery 14.

In step S23, the CPU 10*a* controls the alternator 15 to terminate charging. More specifically, the CPU 10*a* controls the alternator 15 to make the alternator 15 stop generating power and thereby terminates charging. This makes it possible to prevent the rechargeable battery 14 from generating heat or suffering damage, for example.

Next, the process illustrated in step S11 and step S15 of FIG. 7 will be described in detail with reference to FIG. 8. Once the process illustrated in FIG. 8 is started, the following steps are executed.

In step S30, CPU 10*a* references the output of the current sensor 12 to measure the current I1 that is flowing through the rechargeable battery 14 at that point in time.

In step S31, the CPU 10*a* determines whether a prescribed period of time ΔT has elapsed. Upon determining that the prescribed period of time ΔT has elapsed (Y in step S31), the CPU 10*a* proceeds to step S32, and otherwise (N in step S31), the CPU 10*a* continues to repeat the same process. For example, if one hour or several hours have elapsed as the period of time ΔT, the CPU 10*a* determines Y and proceeds to step S32. Here, this period of time ΔT may be set to be longer or shorter than described above according to the accuracy of the current sensor 12, observational error, or the like.

In step S32, CPU 10*a* references the output of the current sensor 12 to measure the current I2 that is flowing through the rechargeable battery 14 at that point in time.

In step S33, the CPU 10*a* uses the formula ΔI=I2−I1 to calculate the current difference ΔI between the current I1 measured in step S30 and the current I2 measured in step S32.

In step S34, the CPU 10*a* uses the formula A=ΔI/ΔT to calculate the current slope A on the basis of the current difference ΔI calculated in step S33 and the ΔT from step S31. Then, the CPU 10*a* returns to the original process.

Next, the process illustrated in step S20 of FIG. 7 will be described in detail with reference to FIG. 9. Once the process illustrated in FIG. 9 is started, the following steps are executed.

In step S50, CPU 10*a* references the output of the voltage sensor 11 to measure the terminal voltage V1 of the rechargeable battery 14 at that point in time.

In step S51, the CPU 10*a* determines whether a prescribed period of time ΔT has elapsed. Upon determining that the prescribed period of time ΔT has elapsed (Y in step S51), the CPU 10*a* proceeds to step S52, and otherwise (N in step S51), the CPU 10*a* continues to repeat the same process. For example, if several minutes or several hours have elapsed as the period of time ΔT, the CPU 10*a* determines Y and proceeds to step S52. Here, this period of time ΔT may be set to be longer or shorter than described above according to at which of the timings in FIG. 6(A) the detection is performed.

In step S52, CPU 10*a* references the output of the voltage sensor 11 to measure the terminal voltage V2 of the rechargeable battery 14 at that point in time.

In step S53, the CPU 10*a* uses the formula ΔV=V2−V1 to calculate the voltage difference ΔV between the voltage V1 measured in step S50 and the voltage V2 measured in step S52.

In step S54, the CPU 10*a* uses the formula B=ΔV/ΔT to calculate the voltage slope B on the basis of the voltage difference ΔV calculated in step S53 and the ΔT from step S51. Then, the CPU 10*a* returns to the original process.

The processes described above make it possible to implement the operation described above.

(C) Description of Alternative Embodiments

The embodiments described above are only examples, and the present invention is not limited only to the embodiments described above. For example, although in the embodiments described above the transition to constant-voltage charging is made when the SOC becomes greater than or equal to 90% and occurrence of short-circuits is then detected from temporal changes in current during this constant-voltage charging, the transition to constant-voltage charging and the processes described above can be executed at an SOC of less than 90%.

Moreover, during constant-current charging, a temporary transition to constant-voltage charging may be made in order to detect short-circuits, and the occurrence of short-circuits may be detected from temporal changes in current observed while doing this.

Furthermore, although in the embodiments described above the occurrence of short-circuits is detected or determined on the basis of currents I1 and I2 or voltages V1 and V2 measured at two different times, currents or voltages may be measured at three or more different times and these measured currents or voltages may be fed into an approximation formula to obtain the slopes, for example.

In addition, when the rechargeable battery 14 is new, changes in current during constant-voltage charging may be stored in the RAM 10*c* as parameters 10*ca*, and the occurrence of short-circuits may be detected or determined using these changes in current from when the rechargeable battery 14 was new as a reference, for example. More specifically, the slope of the current when the rechargeable battery 14 is new can be stored as A0 (typically a negative value), and the difference (A−A0) against the A at a given point in time can be calculated, for example. If this difference is close to zero, it can be determined that the rechargeable battery 14 is operating normally, and when this difference becomes greater than or equal to a prescribed threshold value (for example, a positive threshold value), the occurrence of a short-circuit can be detected. Here, because as illustrated in FIG. 4B the slope of the current changes depending on the SOC of the rechargeable battery 14, the slope may be obtained and stored at each SOC, and the slope corresponding to the SOC at that given point in time can be retrieved to then execute the process described above.

Moreover, in the embodiments described above, when occurrence of a short-circuit is detected this information is conveyed, when the short-circuit is progressing this information is conveyed and charging is restricted, and when the short-circuit has further progressed this information is conveyed and charging is terminated. However, these processes are only examples, and processes other than these may be executed at each respective stage. For example, after a short-circuit occurs, there is a high possibility that the engine 16 will not be able to be restarted, and therefore any idling reduction features may be disabled or the user may be prompted to go to a repair shop, dealer, gas station, or the like before stopping the engine 16.

Furthermore, although the embodiments described above do not take the temperature of the electrolyte of the rechargeable battery 14 into account, the temperature of the electrolyte may be estimated using the temperature sensor 13, and the estimated temperature may be used to convert to values in some reference state. For example, at least one of the current and voltage measured when the temperature of the electrolyte estimated by the temperature sensor 13 is 30° C. may be normalized to a corresponding value at a reference state of 25° C. by using a conversion table or the like, for example.

In addition, although in the embodiments above the alternator 15 or the like were described as being assumed to have a feature for implementing restrictions on current, when no such features for implementing restrictions on current are present, the current illustrated in FIG. 6B changes depending on the RPM of the engine 16 and the like, for example. As a result, the voltage in FIG. 6A changes in response to these changes in current. In such cases, it is likely that the slope of the voltage illustrated in FIG. 6A would change or that the value V4 at which the voltage converges would change, for example. Therefore, it would be preferable that such changes in voltage be taken into account when setting the threshold value Th3 to be compared against the voltage slope B in step S21 of FIG. 7.

Moreover, as illustrated in FIGS. 5A-5B, when the rechargeable battery 14 is being charged at a constant voltage (as illustrated in FIG. 5A), the output signal from the current sensor 12 may be referenced, and if the temporal rate of increase in the charging current is increasing over time (as illustrated in FIG. 5B), it may be determined that there is a possibility that short-circuiting of the rechargeable battery 14 has occurred. In other words, if the time derivative of the charging current during constant-voltage charging is increasing over time (and exceeds a prescribed threshold value, for example), it may be determined that there is a possibility that the rechargeable battery 14 (i.e., at least some of the cells therein) has short-circuited.

Figure 8:
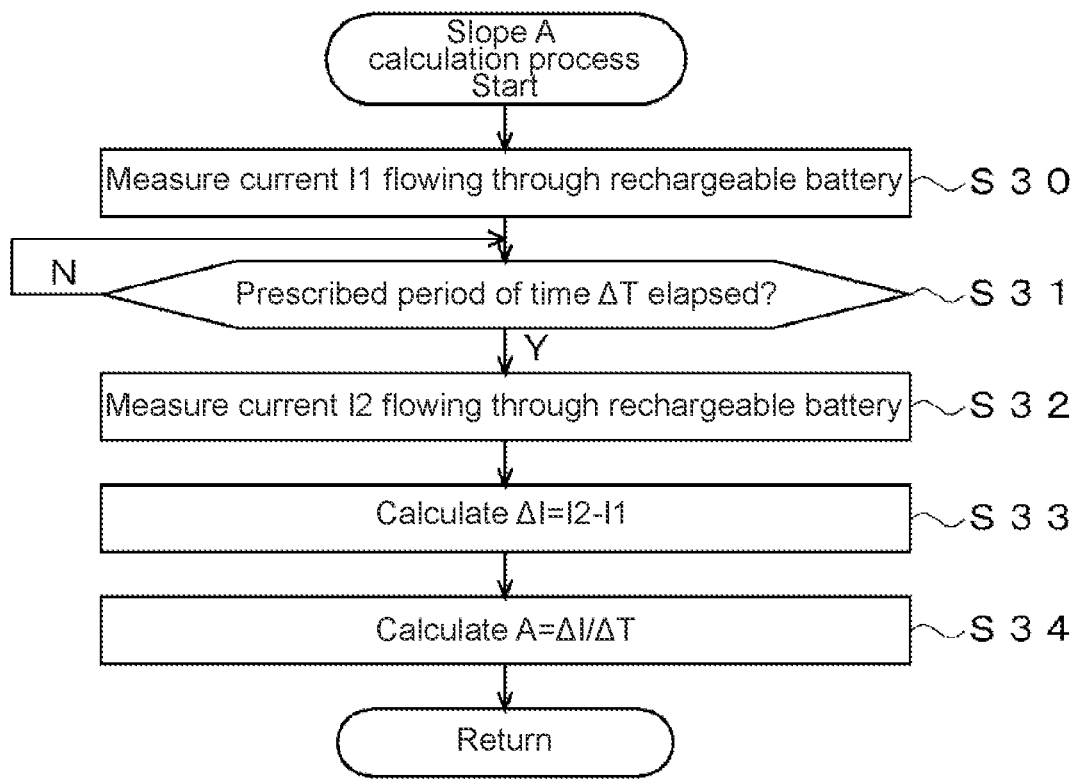
FIG. 8 is a flowchart for explaining the details of the current slope A calculation process illustrated in FIG. 7.
Figure 9:
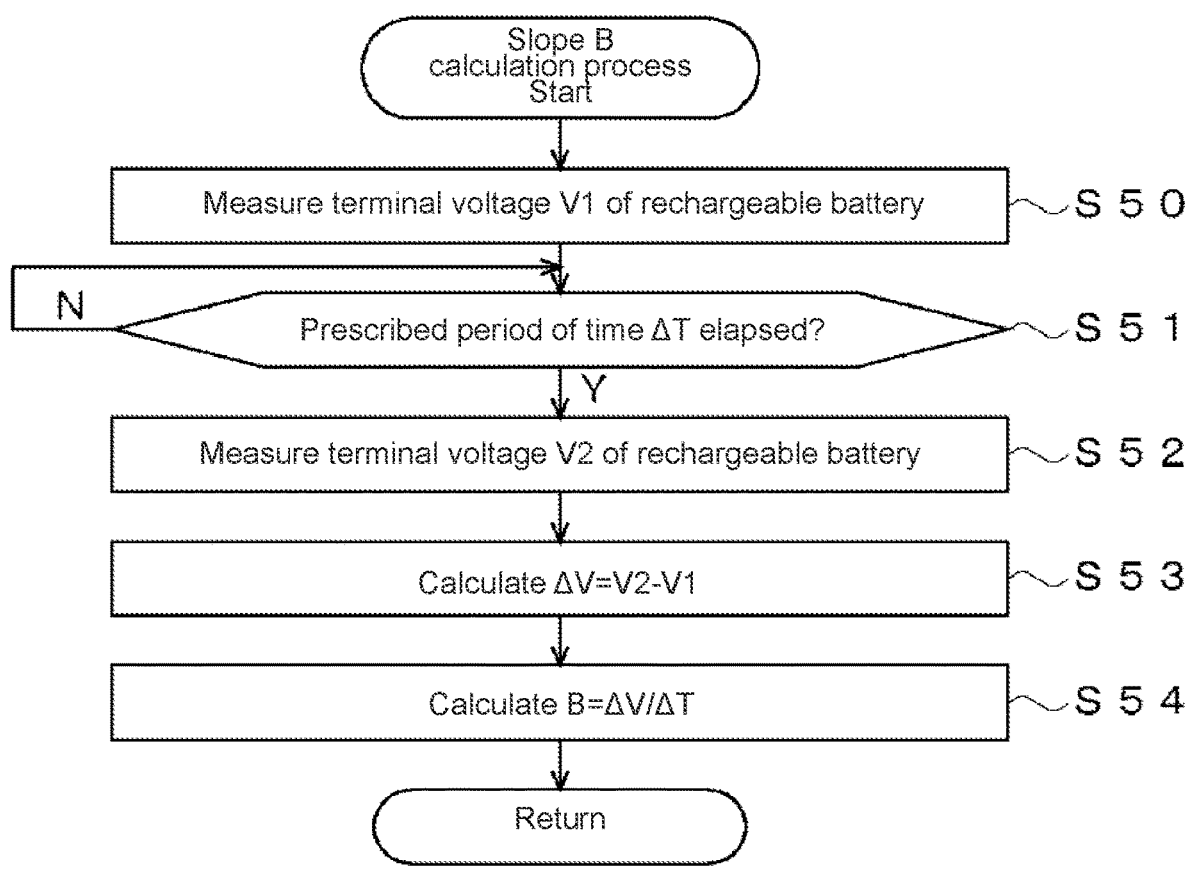
FIG. 9 is a flowchart for explaining the details of the voltage slope B calculation process illustrated in FIG. 7.

Furthermore, the flowcharts illustrated in FIGS. 7 to 9 are only examples, and the present invention is not limited to only the processes in these flowcharts.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A rechargeable battery short-circuit early detection device that detects a short-circuit in a rechargeable battery that has an electrolyte and contains one or more battery cells, the device comprising one or more processors configured to be connected to a current sensor that detects a charging current of the rechargeable battery, wherein the one or more processors are programmed to:
   determine whether or not the rechargeable battery is being charged with a constant voltage;
   detect a temporal slope of the charging current if the one or more processors determine that the rechargeable battery is being charged with the constant voltage;
   if the detected temporal slope of the charging current exceeds a first threshold, determine that there is a possibility that a short circuit has occurred in at least one of the cells of the rechargeable battery and output a signal indicating said possibility;
   when the one or more processors determine that there is the possibility that at least one of the cells of the rechargeable battery has short-circuited, detect anew a temporal slope of the charging current after a prescribed period of time has elapsed since the determination of said possibility; and
   thereafter, if the anew detected temporal slope of the charging current exceeds a second threshold that is greater than the first threshold, determine that there is a possibility that the short-circuit is progressing, and output a signal indicating said possibility.

2. The rechargeable battery short-circuit early detection device according to claim 1, wherein the one or more processors are configured to be connected to a voltage sensor that detects a charging voltage of the rechargeable battery, and the one or more processors are further programed to:
   determine whether or not the rechargeable battery is being charged with a constant current;
   if the one or more processors determine that there is the possibility that the short-circuit is progressing and that the rechargeable battery is being charged with the constant current, detect a temporal slope of the charging voltage; and
   if the detected temporal slope of the charging voltage is less than a third threshold, determine that the short-circuit has further progressed, and output a signal indicating that the short-circuit has further progressed.

3. A rechargeable battery short-circuit early detection device that detects a short-circuit in a rechargeable battery that has an electrolyte and contains one or more battery cells, the device comprising one or more processors configured to be connected to a current sensor that detects a charging current of the rechargeable battery and to a temperature sensor detecting a temperature of the electrolyte or a temperature of a surrounding environment of the rechargeable battery, wherein the one or more processors are programmed to:
   while the rechargeable battery is being charged, monitor the charging current detected by the current sensor and the temperature detected by the temperature sensor so as to produce a plurality of charging current values as a function of time;
   convert each of the plurality of charging current values detected by the current sensor when a temperature of the electrolyte differs from a reference temperature to a converted charging current value in a reference state of the electrolyte that is at the reference temperature in accordance with the temperature of the electrolyte at which the charging current value is detected, thereby producing a plurality of the converted charging current values, the temperature of the electrolyte being detected by the temperature sensor or being estimated by the one or more processors from the temperature of the surrounding environment detected by the temperature sensor;
   detect a temporal slope of the plurality of converted charging current values when the one or more processors determine that the rechargeable battery is being charged with a constant voltage;
   if the detected temporal slope of the plurality of converted charging current values exceeds a first threshold, determine that there is a possibility that a short circuit has occurred in at least one of the cells of the rechargeable battery and output a signal indicating said possibility;
   when the one or more processors determine that there is the possibility that at least one of the cells of the rechargeable battery has short-circuited, detect anew a temporal slope of the plurality of converted charging current values after a prescribed period of time has elapsed since the determination of said possibility; and thereafter, if the anew detected temporal slope of the plurality of converted charging current values exceeds a second threshold that is greater than the first threshold, determine that there is a possibility that the short-circuit is progressing, and output a signal indicating said possibility.

4. The rechargeable battery short-circuit early detection device according to claim 3, wherein the one or more processors are configured to be connected to a voltage sensor that detects a charging voltage of the rechargeable battery, and the one or more processors are further programed to:

determine whether or not the rechargeable battery is being charged with a constant current;

convert each of the plurality of charging voltage values detected by the voltage sensor when the temperature of the electrolyte differs from a reference temperature to a converted charging voltage value in a reference state of the electrolyte that is at the reference temperature in accordance with the temperature of the electrolyte at which the charging voltage value is detected, thereby producing a plurality of the converted charging voltage values, the temperature of the electrolyte being detected by the temperature sensor or being estimated by the one or more processors from the temperature of the surrounding environment detected by the temperature sensor;

if the one or more processors determine that there is the possibility that the short-circuit is progressing and that the rechargeable battery is being charged with the constant current, detect a temporal slope of the plurality of the converted charging voltage values; and if the detected temporal slope of the plurality of converted charging voltage values is less than a third threshold, determine that the short-circuit has further progressed, and output a signal indicating that the short-circuit has further progressed.

5. A rechargeable battery short-circuit early detection method that detects a short-circuit in a rechargeable battery that has an electrolyte and contains one or more battery cells, the method being executed by one or more processors configured to be connected to a current sensor that detects a charging current of the rechargeable battery and to a temperature sensor detecting a temperature of the electrolyte or a temperature of a surrounding environment of the rechargeable battery, the method comprising:

while the rechargeable battery is being charged, monitoring the charging current detected by the current sensor and the temperature detected by the temperature sensor so as to produce a plurality of charging current values as a function of time;

converting each of the plurality of charging current values detected by the current sensor when a temperature of the electrolyte differs from a reference temperature to a converted charging current value in a reference state of the electrolyte that is at the reference temperature in accordance with the temperature of the electrolyte at which the charging current value is detected, thereby producing a plurality of the converted charging current values, the temperature of the electrolyte being detected by the temperature sensor or being estimated by the one or more processors from the temperature of the surrounding environment detected by the temperature sensor;

detecting a temporal slope of the plurality of converted charging current values when the rechargeable battery is being charged with a constant voltage;

if the detected temporal slope of the plurality of converted charging current values exceeds a first threshold, determining that there is a possibility that a short circuit has occurred in at least one of the cells of the rechargeable battery and outputting a signal indicating said possibility;

when it is determined that there is the possibility that at least one of the cells of the rechargeable battery has short-circuited, detecting anew a temporal slope of the plurality of converted charging current values after a prescribed period of time has elapsed since the determination of said possibility; and thereafter, if the anew detected temporal slope of the plurality of converted charging current values exceeds a second threshold that is greater than the first threshold, determining that there is a possibility that the short-circuit is progressing, and outputting a signal indicating said possibility.

* * * * *